United States Patent
Sazawa

(10) Patent No.: US 10,931,794 B2
(45) Date of Patent: Feb. 23, 2021

(54) COMMUNICATION APPARATUS AND COMMUNICATION CONTROL METHOD

(71) Applicant: FUJITSU LIMITED, Kawasaki (JP)

(72) Inventor: Shinichi Sazawa, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 30 days.

(21) Appl. No.: 16/356,562

(22) Filed: Mar. 18, 2019

(65) Prior Publication Data

US 2019/0327343 A1 Oct. 24, 2019

(30) Foreign Application Priority Data

Apr. 24, 2018 (JP) .............................. JP2018-083471

(51) Int. Cl.
*H04L 29/06* (2006.01)
*H03M 7/30* (2006.01)
*H03M 7/40* (2006.01)
*H04L 12/46* (2006.01)

(52) U.S. Cl.
CPC .............. *H04L 69/04* (2013.01); *H03M 7/40* (2013.01); *H03M 7/70* (2013.01); *H04L 12/4604* (2013.01); *H04L 69/08* (2013.01)

(58) Field of Classification Search
CPC ............ H03M 7/34; H03M 7/70; H03M 7/40; H03M 7/3084; G06F 16/1744; G06F 16/90344; G06F 16/9014; G06F 16/10; H04L 69/04; H04L 29/06; H04L 12/4633; H04L 69/08; H04L 69/16; H04L 12/4604
See application file for complete search history.

(56) References Cited

U.S. PATENT DOCUMENTS

| | | | |
|---|---|---|---|
| 6,320,522 B1 | 11/2001 | Satoh | |
| 7,275,115 B2 * | 9/2007 | Bunn | H03M 7/30 341/51 |
| 7,420,992 B1 * | 9/2008 | Fang | H04L 12/4633 370/477 |
| 8,872,677 B2 * | 10/2014 | Litvak | H03M 7/3084 341/106 |
| 2005/0219076 A1 * | 10/2005 | Harris | G06F 16/10 341/51 |

FOREIGN PATENT DOCUMENTS

| | | |
|---|---|---|
| JP | 2000-124810 | 4/2000 |
| JP | 2015-201050 | 11/2015 |

* cited by examiner

*Primary Examiner* — Hanh N Nguyen
(74) *Attorney, Agent, or Firm* — Fujitsu Patent Center

(57) ABSTRACT

A communication apparatus includes a memory, and a processor coupled to the memory and the processor configured to receive communication data, measure a usable communication band width for communication with a destination apparatus, determine a parameter relating to a reduction ratio for a data amount of the communication data, based on the measured communication band width, reduce the data amount of the communication data, based on the determined parameter, and transmit the communication data of the reduced data amount to the destination apparatus.

5 Claims, 12 Drawing Sheets

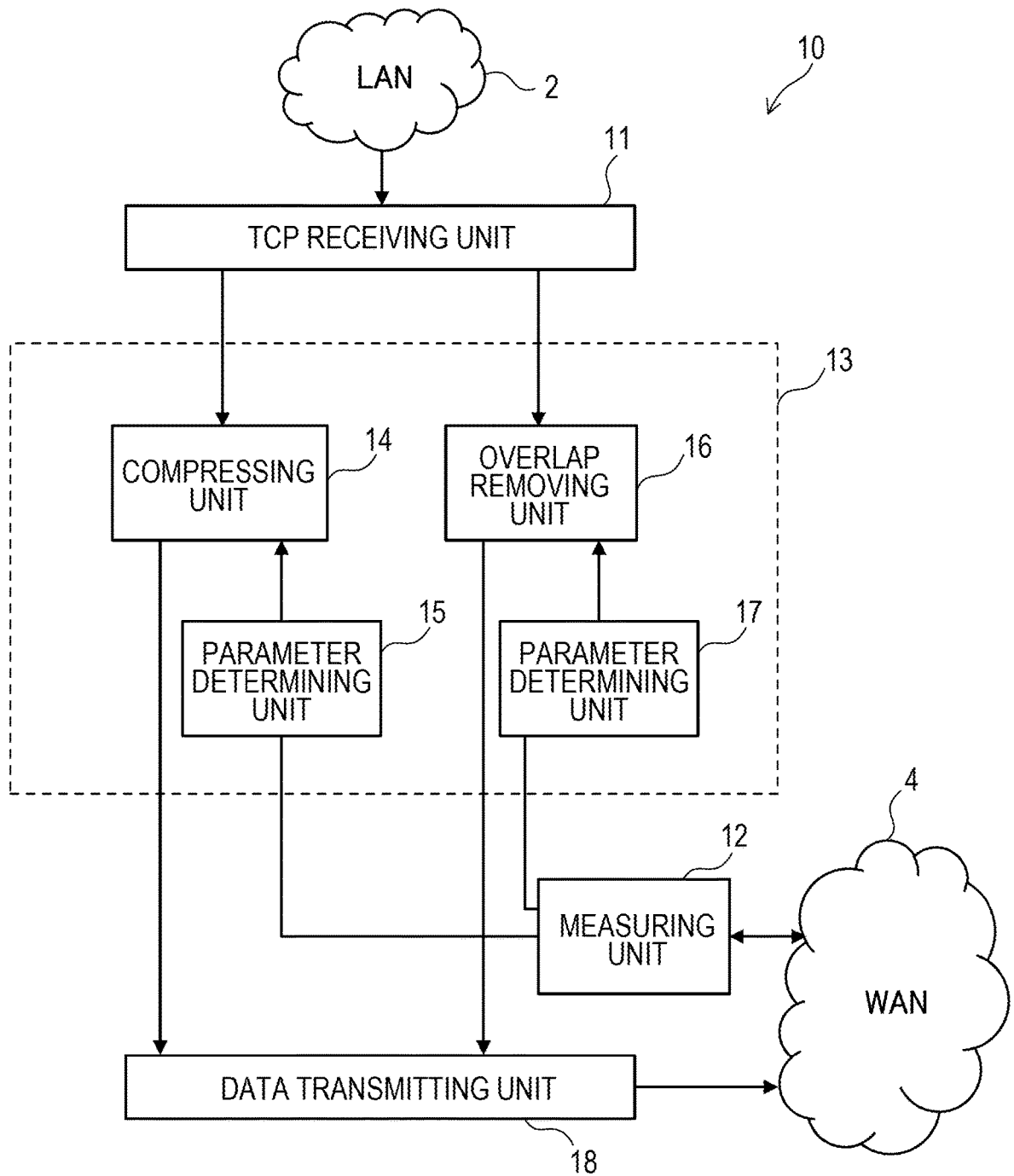

FIG. 3

1 There was nothing so VERY remarkable in that; nor
2 did Alice think it so VERY much out of the way to hear
3 the Rabbit say to itself, 'Oh dear! Oh dear! I shall be
4 late!' (when she thought it over afterwards, it
5 occurred to her that she ought to have wondered at
6 this, but at the time it all seemed quite natural); but
7 when the Rabbit actually TOOK A WATCH OUT OF
8 ITS WAISTCOAT-POCKET

FIG. 6

| CASE NO. | BAND WIDTH (MB/sec) | DEPTH | PROCESSING SPEED (MB/sec) | COMPRESSION RATE | NETWORK TRANSFER TIME | COMPRESSION TIME | TRANSFER TIME (WITH REDUCTION) | TRANSFER TIME (WITHOUT REDUCTION) | ACCELERATION MAGNIFICATION |
|---|---|---|---|---|---|---|---|---|---|
| 1 | 100.00 | 10 | 300.00 | 0.50 | 0.50 | 0.33 | 0.83 | 1.00 | 1.20 |
| 2 | 100.00 | 20 | 100.00 | 0.10 | 0.10 | 1.00 | 1.10 | 1.00 | 0.91 |
| 3 | 10.00 | 10 | 300.00 | 0.50 | 5.00 | 0.33 | 5.33 | 10.00 | 1.88 |
| 4 | 10.00 | 20 | 100.00 | 0.10 | 1.00 | 1.00 | 2.00 | 10.00 | 5.00 |

FIG. 8

| DEPTH PARAMETER | ESTIMATED PROCESSING SPEED (Byte/sec) | ESTIMATED COMPRESSION RATE (0.0 − 1.0) |
|---|---|---|
| X | speed_x | ratio_x |
| Y | speed_y | ratio_y |
| Z | speed_z | ratio_z |

FIG. 10

| CHARACTER STRING | HASH VALUE | POSITION |
|---|---|---|
| There<br>was<br>nothing<br>⋮ | 0110101 ⋯<br>1011001 ⋯<br>1100011 ⋯<br>⋮ | 0001<br>0007<br>0011<br>⋮ |

| HASH VALUE | POSITION |
|---|---|
| 11010110 ⋯ | 0001 |
| 01010110 ⋯ | 0031 |
| 11100011 ⋯ | 0094 |
| ⋮ | ⋮ |

COMMUNICATION APPARATUS AND COMMUNICATION CONTROL METHOD

CROSS-REFERENCE TO RELATED APPLICATION

This application is based upon and claims the benefit of priority of the prior Japanese Patent Application No. 2018-83471, filed on Apr. 24, 2018, the entire contents of which are incorporated herein by reference.

FIELD

The embodiments discussed herein are related to a communication apparatus and a communication control method.

BACKGROUND

In recent years, with spread of cloud computing and extension of mobile communication or the like, the amount of data to be transmitted over a wide area network (WAN) is rapidly increasing. Accordingly, technologies to accelerate such communication have been developed.

For example, one of for achieving acceleration of data transmission is Universal Network Acceleration Protocol (UNAP), which has been put to practical use and may control retransmissions due to packet losses. Also, a technology has been widely spread which may optimize transmission data to reduce the amount of data to be transmitted. For example, the reduction of the amount of data to be transmitted may be achieved by a technology which compresses transmission data and a technology which removes overlapping transmission data.

A technology has been proposed which may perform efficient compression on both of a long character string and a short character string (see Japanese Laid-open Patent Publication No. 2000-124810, for example). Also, a technology has been proposed which may delete overlapping data (see Japanese Laid-open Patent Publication No. 2015-201050, for example).

SUMMARY

According to an aspect of the embodiments, a communication apparatus includes a memory, and a processor coupled to the memory and the processor configured to receive communication data, measure a usable communication band width for communication with a destination apparatus, determine a parameter relating to a reduction ratio for a data amount of the communication data, based on the measured communication band width, reduce the data amount of the communication data, based on the determined parameter, and transmit the communication data of the reduced data amount to the destination apparatus.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 is a diagram illustrating an example of a WAN acceleration apparatus;

FIG. 3 is a diagram illustrating an example of data compression;

FIG. 6 is a diagram illustrating an example of a method for determining a depth parameter;

FIG. 8 is a diagram illustrating an example of a table recording a relationship between depth parameters and compression performance;

FIG. 10 is a diagram illustrating an example of a hash value table to be referred by the compressing unit;

DESCRIPTION OF EMBODIMENTS

Conventional technologies may perform processing (such as compression or overlap removal) for reducing the amount of data to be transmitted without considering the state of a network. For example, data compression and/or data overlap removal is/are performed based on a parameter that has been designated in advance. Because of this, the data transfer time between ends may not be optimized.

With reference to drawings, embodiments of a technology for shortening a data transfer time will be described in detail below.

Figure 1:
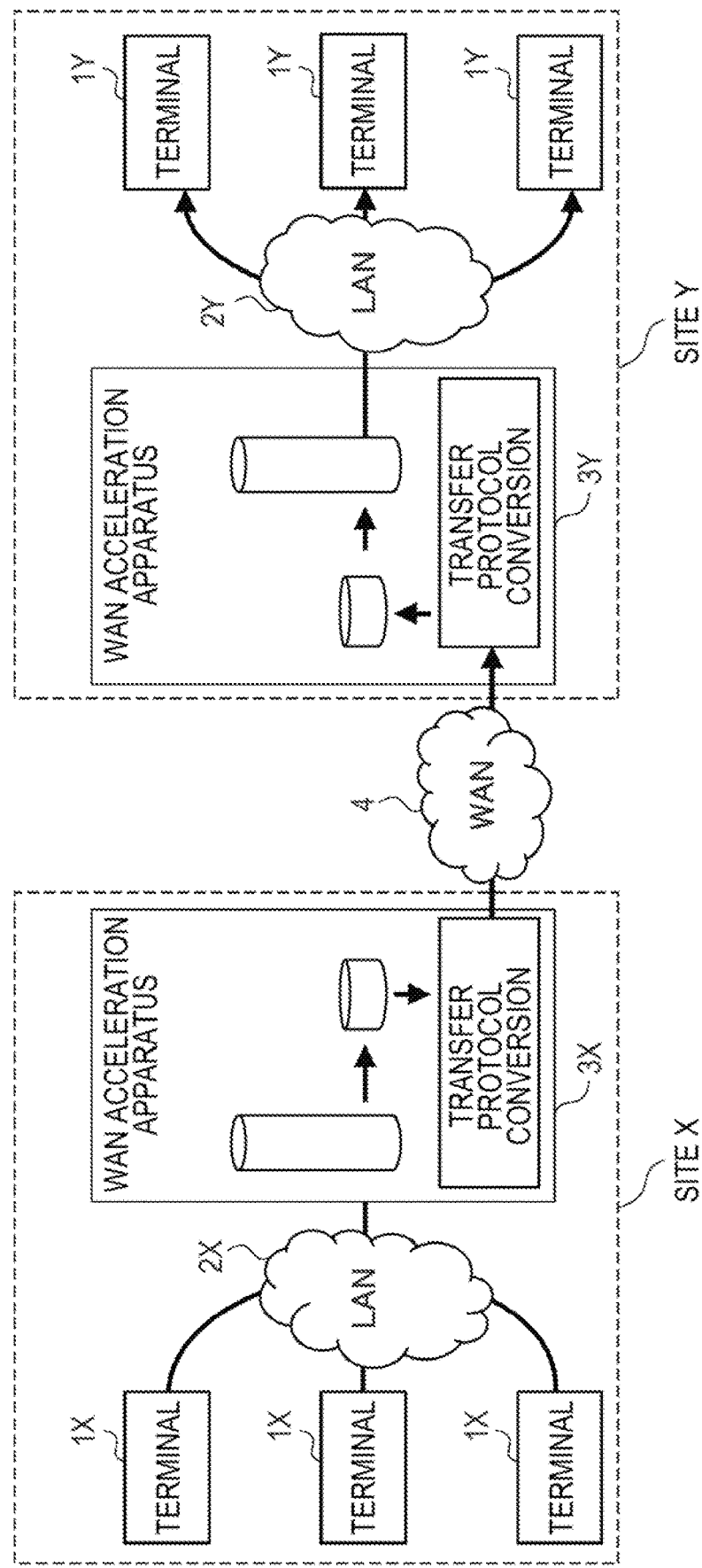
FIG. 1 is a diagram illustrating an example of a communication system.

FIG. 1 illustrates an example of a communication system according to an embodiment of the present disclosure. According to the embodiment, a communication system 100 connects a site X and a site Y by using a WAN 4. Each of the sites has a local area network (LAN). A plurality of terminal apparatuses is connected to each of the LANs. More specifically, for example, the site X has a LAN 2X, and the site Y has a LAN 2Y. A plurality of terminal apparatuses 1X is connected to the LAN 2X, and a plurality of terminal apparatuses 1Y is connected to the LAN 2Y. Each of the terminal apparatuses 1X and 1Y may be a server computer, for example.

Comparing with the LANs 2X and 2Y, the WAN 4 has a much lower transmission speed. In the example illustrated in FIG. 1, the LANs 2X and 2Y have a transmission speed of 10 Gbps while the WAN 4 has a transmission speed of 100 Mbps. Accordingly, each of the sites has a WAN acceleration apparatus. In other words, for example, in the site X, a WAN acceleration apparatus 3X is implemented between the LAN 2X and the WAN 4. In the site Y, a WAN acceleration apparatus 3Y is implemented between the LAN 2Y and the WAN 4.

Each of the WAN acceleration apparatuses 3X and 3Y has a function of reducing the data amount of communication data and a function of converting a communication protocol. For example, in a case where communication data are to be transmitted from the terminal apparatus 1X to the terminal apparatus 1Y, the WAN acceleration apparatus 3X reduces the data amount of the communication data received from the terminal apparatus 1X over the LAN 2X. Hereinafter, communication data having a data amount reduced by the WAN acceleration apparatus will sometimes be called "compressed data". Here, the "compress" includes overlap removal, which will be described below. The WAN acceleration apparatus 3X performs protocol conversion on the compressed data. For example, the WAN acceleration apparatus 3X having received a TCP packet from the terminal apparatus 1X converts the TCP packet to a UDP packet and transmits the UDP packet to the WAN 4. In this case, the compressed data are stored in the UDP packet.

The WAN acceleration apparatus 3Y executes protocol conversion on the compressed data received through the WAN 4. In the example above, the WAN acceleration apparatus 3Y converts the UDP packet received through the WAN 4 to a TCP packet. The WAN acceleration apparatus 3Y decompresses the compressed data extracted from the TCP packet to reconstruct the communication data. The reconstructed communication data are transferred to the terminal apparatus 1Y designated as a destination through the LAN 2Y.

FIG. 2 illustrates an example of a WAN acceleration apparatus according to an embodiment of the present disclosure. FIG. 2 illustrates functions for transmitting communication data. In other words, for example, FIG. 2 does not illustrate functions for receiving communication data.

The WAN acceleration apparatus 10 includes a TCP receiving unit 11, a measuring unit 12, a reducing unit 13, and a data transmitting unit 18. The WAN acceleration apparatus 10 may have other functions that those illustrated in FIG. 2. The WAN acceleration apparatus 10 operates as the WAN acceleration apparatus 3X implemented in the site X, for example, in the example illustrated in FIG. 1.

The TCP receiving unit 11 terminates a TCP packet received through the LAN 2. The TCP packet is transmitted from a terminal apparatus connected to the LAN 2. The TCP packet has a payload storing communication data to be transferred to a destination terminal. In other words, for example, the TCP receiving unit 11 may receive the communication data through the LAN 2.

The measuring unit 12 is configured to measure a communication band width usable for communication with a destination apparatus connected to the WAN 4. For example, in a case where the WAN acceleration apparatus 10 operates as the WAN acceleration apparatus 3X illustrated in FIG. 1, the measuring unit 12 measures a communication band width usable for communication with the WAN acceleration apparatus 3Y illustrated in FIG. 1.

The measuring unit 12 may transmit a predetermined data amount of communication data to the destination apparatus through the WAN 4, for example. The destination apparatus measures a time period for receiving the communication data and notifies the measurement result to the measuring unit 12. The measuring unit 12 then calculates a usable communication band width based on the data amount of the communication data and the measurement result notified from the destination apparatus. In this case, for example, when the data amount of the communication data is equal to 10 Mbits and the time period for receiving the communication data by the destination apparatus is equal to one second, the usable communication band width is 10 Mbps. However, the method for measuring such a usable communication band width is not particularly limited thereto. The measuring unit 12 may measure a usable communication band width by any arbitrary method.

The reducing unit 13 determines a parameter relating to the ratio for reducing the data amount based on the communication band measured by the measuring unit 12. The reducing unit 13 then reduces the data amount of the communication data based on the parameter. This parameter will be described in detail below.

The reducing unit 13 includes a compressing unit 14, a parameter determining unit 15, an overlap removing unit 16, and a parameter determining unit 17. The reducing unit 13 may include other functions than those illustrated in FIG. 2.

The compressing unit 14 compresses communication data received through the LAN 2 to reduce the data amount. The parameter determining unit 15 is configured to determine a parameter for controlling processing to be performed by the compressing unit 14 based on the communication band width measured by the measuring unit 12. The compressing unit 14 is configured to compress communication data based on the parameter determined by the parameter determining unit 15.

The overlap removing unit 16 removes overlapping data in communication data received through the LAN 2 to reduce their data amount. The parameter determining unit 17 is configured to determine a parameter for controlling processing to be performed by the overlap removing unit 16 based on the communication band width measured by the measuring unit 12. The overlap removing unit 16 is configured to remove overlapping data in communication data based on the parameter determined by the parameter determining unit 15. The process for removing overlapping data is one form of data compression.

The reducing unit 13 may use one of the compressing unit 14 and the overlap removing unit 16 to reduce the data amount of communication data. Alternatively, the reducing unit 13 may use both of the compressing unit 14 and the overlap removing unit 16 to reduce the data amount of communication data. In this case, the processing by the compressing unit 14 is followed by the processing by the overlap removing unit 16. Alternatively, the processing by the overlap removing unit 16 may be performed prior to the processing by the compressing unit 14.

The data transmitting unit 18 is configured to transmit the communication data having a data amount reduced by the reducing unit 13 to the destination apparatus. The data transmitting unit 18 may have a protocol conversion function. For example, the data transmitting unit 18 may convert a TCP packet to a UDP packet and transmit the UDP packet to the WAN 4.

FIG. 3 illustrates an example of data compression to be performed by the compressing unit 14. In the example, the communication data are text data. When the compressing unit 14 detects identical character strings within the text data, the compressing unit 14 replaces the character strings by "occurrence position" and "length".

For example, to perform data compression on "VERY" on the second row, the compressing unit 14 searches a character string that is matched with "VERY" or a part thereof. Assuming here that a forward search is to be performed, whether any character string that is matched with "VERY" or a part thereof is present before "VERY" on the second row is determined. In this example, "VERY" is present on the first row. Therefore, in this case, "VERY" on the second row is replaced by positional information indicating the position where "VERY" on the first row occurs and length information indicating the length of the matched character string. The position may be indicated with respect to the beginning of text data or with respect to a character string ("VERY" on the second row) to be searched. The length may be indicated by the byte count or the number of characters of the matched character string. "VERY" may be indicated by 6 bytes, for example. Therefore, when the position and the length can be indicated by the amount of information less than 6 bytes, the data amount of the communication data can be reduced.

To perform data compression on "the Rabbit" on the seventh row, the compressing unit 14 determines whether any character string matched with "the Rabbit" or a part thereof is present before "the Rabbit" on the seventh row or not. In this example, "the" on the sixth row may be extracted, for example. In this case, "the" in "the Rabbit" on the seventh row is replaced by positional information indicating the position and length information indicating the length of "the" on the sixth row. Additionally, "the Rabbit" on the third row is extracted. In this case, "the Rabbit" on the seventh row is replaced by positional information indicating the position and length information indicating the length of "the Rabbit" on the third row. The data compression replacing "the Rabbit" on the seventh row by the position and length of "the Rabbit" on the third row has a higher compression ratio (or a lower value of the compression ratio) than that of the data compression replacing a part of "the Rabbit" on the seventh row by the position and length of "the" on the sixth row. According to this example, the compression ratio represents a ratio of the amount of information of a compressed character string to the amount of information of the character string before compressed.

According to the data compression above, as the number of characters of a character string matched with a search target increases, the compression ratio increases. However, the character string search may be performed in a wider range to discover a character string having a higher number of characters matched with the search target. As the search range is increased for a higher compression ratio, the processing time for the character string search increases.

Accordingly, for performing the data compression above, a parameter max_dist representing a maximum search range may be adjusted as required. For example, in a case where a high compression ratio is important, a higher parameter max_dist is used for increasing the maximum search range. On the other hand, in a case where a short processing time is important, a lower parameter max_dist is used for reducing the maximum search range. In the WAN acceleration apparatus 10 illustrated in FIG. 2, the parameter determining unit 15 determines the parameter max_dist based on a usable communication band width.

Figure 4:
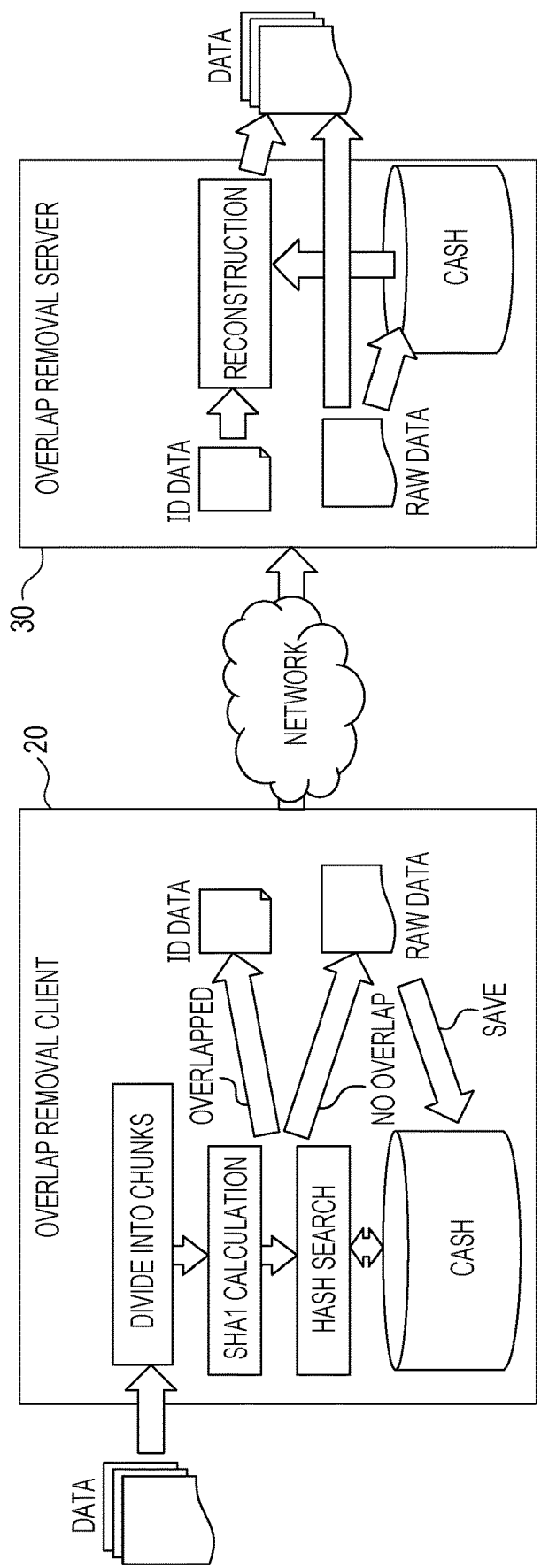
FIG. 4 is a diagram illustrating an example of overlap removal.

FIG. 4 illustrates an example of an overlap removal method. In this example, an overlap removal client 20 removes overlapping data in communication data. The communication data from which overlapping data are removed are transmitted from the overlap removal client 20 to an overlap removal server 30 over a network. The overlap removal server 30 reconstructs the communication data. The overlap removal client 20 corresponds to the site X of FIG. 1 and the overlap removal server 30 corresponds to the site Y of FIG. 1.

The overlap removal client 20 divides the communication data into data blocks each called a "chunk". The chunk is a variable length block of 1 to 4 Kbytes. Next, the overlap removal client 20 calculates a hash value of each of the chunks by using Secure Hash Algorithm (SHA). The overlap removal client 20 searches hash values that are matched with each other to discover overlapping chunks (or data blocks that are matched with each other).

If no chunk overlapping the processing target chunk is found, the overlap removal client 20 transmits the data in the processing target chunk to the destination apparatus (overlap removal server 30). At that time, the overlap removal client 20 saves the data (raw data in FIG. 4) transmitted to the destination apparatus in a cache memory. On the other hand, if a chunk overlapping the processing target chunk is found, the overlap removal client 20 transmits an index (ID data in FIG. 4) indicating the data within the processing target chunk to the destination apparatus.

The overlap removal server 30 having received the raw data outputs the raw data and saves the raw data in a cache memory. On the other hand, the overlap removal server 30 having received the ID data searches the ID data through the cache memory and reconstructs the data corresponding to the ID data. The data amount of the ID data is much lower than the data amount of the raw data. Therefore, the amount of data to be transferred can be reduced.

Figure 5:
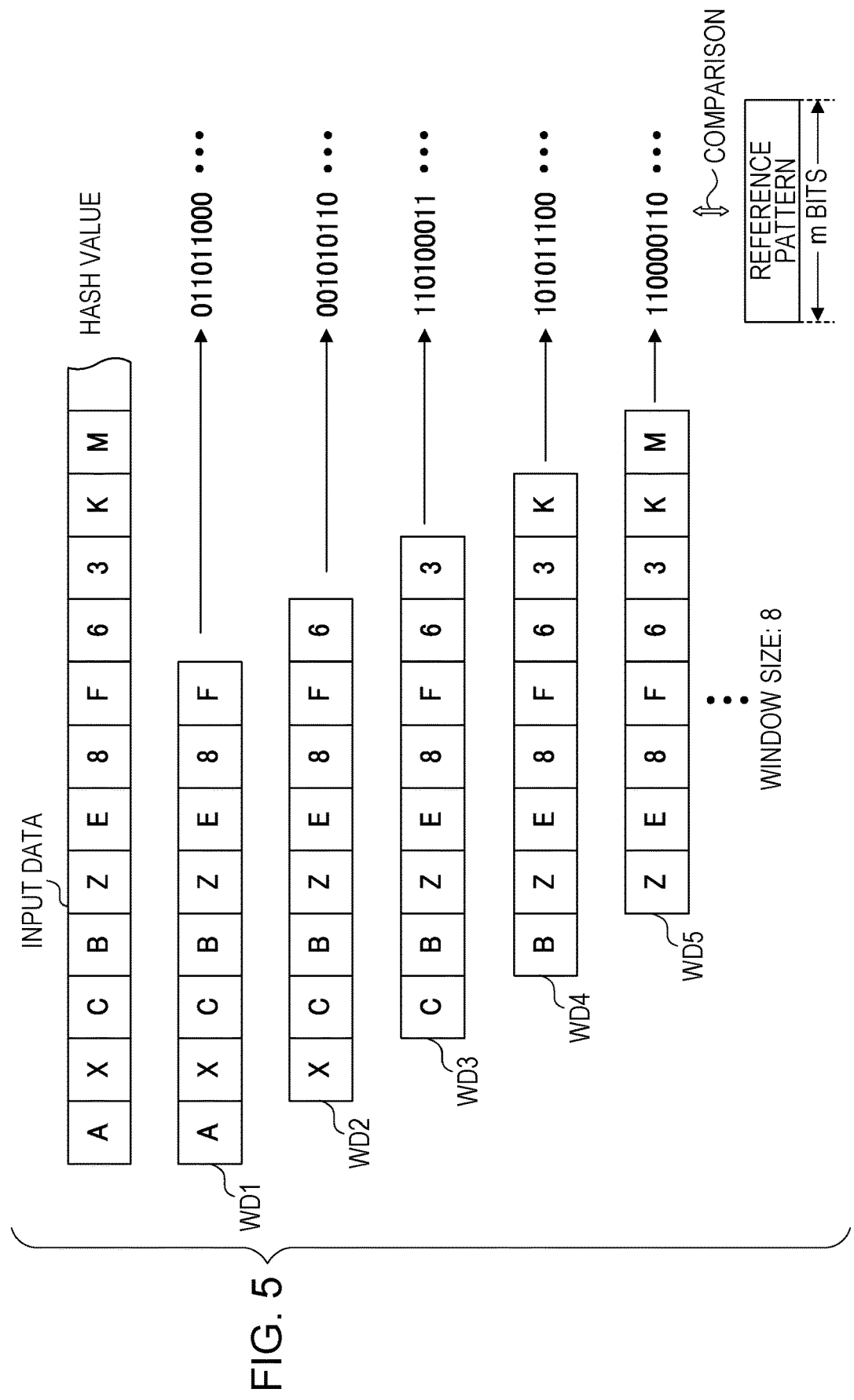
FIG. 5 is a diagram for describing a method for dividing input data into a plurality of chunks.

Next, a method will be described which divides input data into a plurality of chunks. According to the method, as illustrated in FIG. 5, an extraction window is slid by one byte on input data so that window data may be acquired. In this example, the window size is equal to 8 bytes, and window data pieces WD1, WD2, WD3, . . . are extracted. Rabin fingerprint algorithm is applied to calculate a hash value for each of the window data pieces. A hash value calculated by Rabin fingerprint algorithm may sometimes be called a "fingerprint". The window size in reality is sufficiently higher than 8 bytes and may be equal to 64 bytes, for example.

A hash value f by Rabin fingerprint algorithm may be calculated by Expression (1). In the expression, n represents a window size. $w_0$ to $w_{n-1}$ represent data pieces within extraction windows. p is a relatively high prime number, for example.

$$f_p(0, n) = \sum_{k=0}^{n-1} w_k \cdot p^{n-1-k} \tag{1}$$

This calculation includes n multiplications. Therefore, as the window size increases, the computational complexity for acquiring a hash value increases. A hash value corresponding to each extraction window may be calculated by using a hash value previously acquired for an adjacent extraction window. More specifically, for example, a hash value may be calculated by Expression (2). Three multiplications are performed in Expression (2) for acquiring a hash value, resulting in low computational complexity.

$$f_p(1, n+1) = f_p(0, n) * p - w_0 * p^n + w_n \tag{2}$$

Next, the beginning m-bit values of each hash value are compared with a predetermined reference pattern. The reference pattern is not particularly limited but may be any desired bit sequence. Assuming that the hash value is a random value, the probability that the beginning m bits of the hash value are matched with the reference pattern is equal to $\frac{1}{2^m}$. When, for example, m is 10, a hash value is obtained having the beginning m-bit values of every $2^{10}$ bytes (or approximately 1 Kbyte) on average being matched with the reference pattern.

A chunk is acquired by delimiting input data when the beginning m-bit values of a hash value calculated in the manner as described above are matched with the reference pattern. Therefore, when m is 10, the average size of chunks is equal to approximately 1 Kbyte. As the value of m increases, the average size of chunks increases. For example, when m is 11, the average size of chunks is equal to approximately 2 Kbytes.

The overlap removal client 20 calculates a hash value for each chunk, as described above, and uses the hash values to search overlapping data. Therefore, as the average size of chunks increases, the number of generated hash values decreases so that the number of searches for overlapping data is reduced. In other words, the processing time for overlap removal decreases. However, in this case, the precision of detection of overlapping data decreases, which may reduce the data compression effect with removal of overlapping data.

On the other hand, a lower average size of each chunk may improve precision for detection of overlapping data, which increases the data compression effect with removal of overlapping data. However, in this case, the number of searches for overlapping data increases, which increases the processing time for overlap removal.

Accordingly, when the overlap removal as described above is to be performed, the value of the parameter m representing the length of the reference pattern is adjusted as required. The parameter m substantially designates the average size of chunks. For example, in a case where a high compression ratio is important, a lower value is used as the parameter m so that the average size of chunks may be reduced. On the other hand, in a case where a shorter processing time is important, a higher value is used as the parameter m so that the average size of chunks may be increased. In the WAN acceleration apparatus 10 illustrated in FIG. 2, the parameter m is determined by the parameter determining unit 17 based on a usable communication band width.

FIG. 6 illustrates an example of a method for determining a depth parameter in the reducing unit 13. The following description assumes that 100-Mbyte data are to be transmitted. It is also assumed that previously evaluating a certain compression algorithm results in "processing speed=300 Mbytes/second, compression ratio=50% (high speed processing, low compression ratio)" with "depth parameter=10" and "processing speed=100 Mbytes/second, compression ratio=10% (low speed processing, high compression ratio)" with "depth parameter=20".

In FIG. 6, a "band width" represents a usable communication band width which is measured by the measuring unit 12 illustrated in FIG. 2. A "depth" represents a parameter for controlling the processing by the reducing unit 13. In the example illustrated in FIG. 3, the depth corresponds to the parameter max_dist designating a maximum search range. In the example in FIG. 4 and FIG. 5, the depth corresponds to the parameter m designating the length of the reference pattern.

A "processing speed" represents the amount of data processable within a unit time period. A "compression ratio" represents the amount of data after a compression to the amount of data before the compression. For example, "compression ratio=0.5" means that the amount of data is reduced to the half by compression.

A "network transfer time" represents a time period for transferring communication data. In the example illustrated in FIG. 1, the network transfer time is a time period for transferring communication data between the WAN acceleration apparatuses 3X and 3Y. It is assumed here that the network transfer time is in proportion to the amount of data. It is further assumed that the network transfer time is in inverse proportion to the communication band width. A "compression time" represents a time period for compressing data in the reducing unit 13.

A "transfer time" represents a sum of a network transfer time and a compression time. In this case, a "transfer time (with reduction)" represents a sum of a network transfer time and a compression time for data compressed by the reducing unit 13. A "transfer time (without reduction)" represents a network transfer time for raw data (i.e. data not compressed in the reducing unit 13).

An "acceleration magnification" represents the degree of improvement of the transfer time because of data compression. In other words, for example, when the transfer time is reduced by the data compression, the acceleration magnification is higher than 1. As the time reduction effect increases, the acceleration magnification increases. The acceleration magnification is acquired by dividing the "transfer time (without reduction)" by the "transfer time (with reduction)".

Cases 1 and 2 have high usable communication band widths. A high communication band width has a suppressed network transfer time thereof. Therefore, in order to reduce a transfer time (a sum of a network transfer time and a compression time), a parameter which reduces the compression time is desirably selected. In the example illustrated in FIG. 6, Case 1 with a depth parameter of 10 has a higher acceleration magnification than Case 2 with a depth parameter of 20. In order to reduce the transfer time with a high communication band width, the depth parameter is desirably reduced.

Cases 3 and 4 have a low usable communication band width. The network transfer time is easily increased with a low communication band width. Therefore, in order to reduce the transfer time, a parameter which increases the compression ratio may desirably be selected so that the amount of data to be transferred can be reduced as much as possible. Referring to the example illustrated in FIG. 6, the acceleration magnification of Case 4 with a depth parameter of 20 is higher than Case 3 with a depth parameter of 10. In order to reduce the transfer time with a low communication band width, a high depth parameter may desirably be increased.

Figure 7:
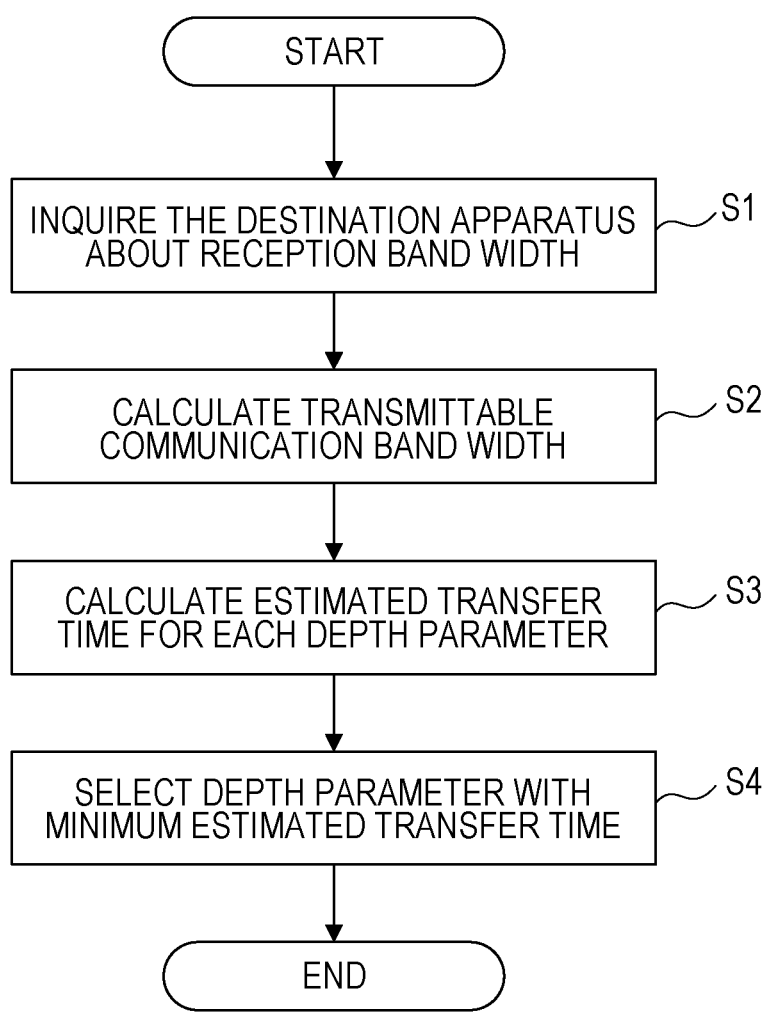
FIG. 7 is a flowchart illustrating an example of processing for determining a depth parameter.

FIG. 7 is a flowchart illustrating an example of processing for determining a depth parameter. The processing in the flowchart is periodically executed. For example, the processing in the flowchart may be executed at intervals of one second while data communication is being performed.

In S1, the measuring unit 12 inquires the destination apparatus about a reception band width. It is assumed here that the destination apparatus is monitoring the reception band width at all times. The destination apparatus then notifies the measuring unit 12 of a measured reception band width.

In S2, the measuring unit 12 calculates a usable communication band width for data transfer to the destination apparatus based on the reception band width notified from the destination apparatus. In this case, the usable communication band width may be equal to the reception band width notified from the destination apparatus. The measuring unit 12 notifies the usable communication band width to the parameter determining units 15 and 17.

In S3, the parameter determining units 15 and 17 calculate estimated transfer times for different depth parameter values. Here, in this example, "estimated processing speed speed_i" and "estimated compression ratio ratio_i" of are measured in advance for a depth parameter i and are recorded in a table as illustrated in FIG. 8. This table is saved in a memory region which may be referred by the parameter determining units 15 and 17.

The parameter determining units 15 and 17 may calculate an estimated transfer time T(i) by using Expression (3), for example.

$$T(i) = \text{ratio}\_i/\text{BW} + \text{speed}\_i \quad (3)$$

In the expression, BW represents a usable communication band width. i represents a depth parameter value. For example, in the data compression illustrated in FIG. 3, the depth parameter i corresponds to the parameter max_dist designating a maximum search range. In this case, the parameter determining unit 15 calculates estimated transfer times for different max_dist values. In the overlap removal illustrated in FIG. 4 and FIG. 5, the depth parameter i corresponds to m representing the length of the reference pattern. In this case, the parameter determining unit 17 may calculate estimated transfer times for m=9, 10, 11, 12, for example.

In S4, the parameter determining units 15 and 17 select a depth parameter with a lowest estimated transfer time. For example, the parameter determining unit 17 may calculate estimated transfer times (T(9), T(10), T(11), T(12)) for m=9, 10, 11, 12 by using Expression (3). In this case, the communication band width BW to be notified from the measuring unit 12 is given by Expression (3) above. It is assumed here that the estimated transfer time T(10) is the lowest. In this case, the parameter determining unit 17 selects "m=10" as the depth parameter.

In this manner, the WAN acceleration apparatus 10 determines the depth parameter based on a usable communication band width. In this case, the WAN acceleration apparatus 10 selects a depth parameter which minimizes the transfer time including the compression processing time. The WAN acceleration apparatus 10 compresses communication data based on the depth parameter.

Figure 9:
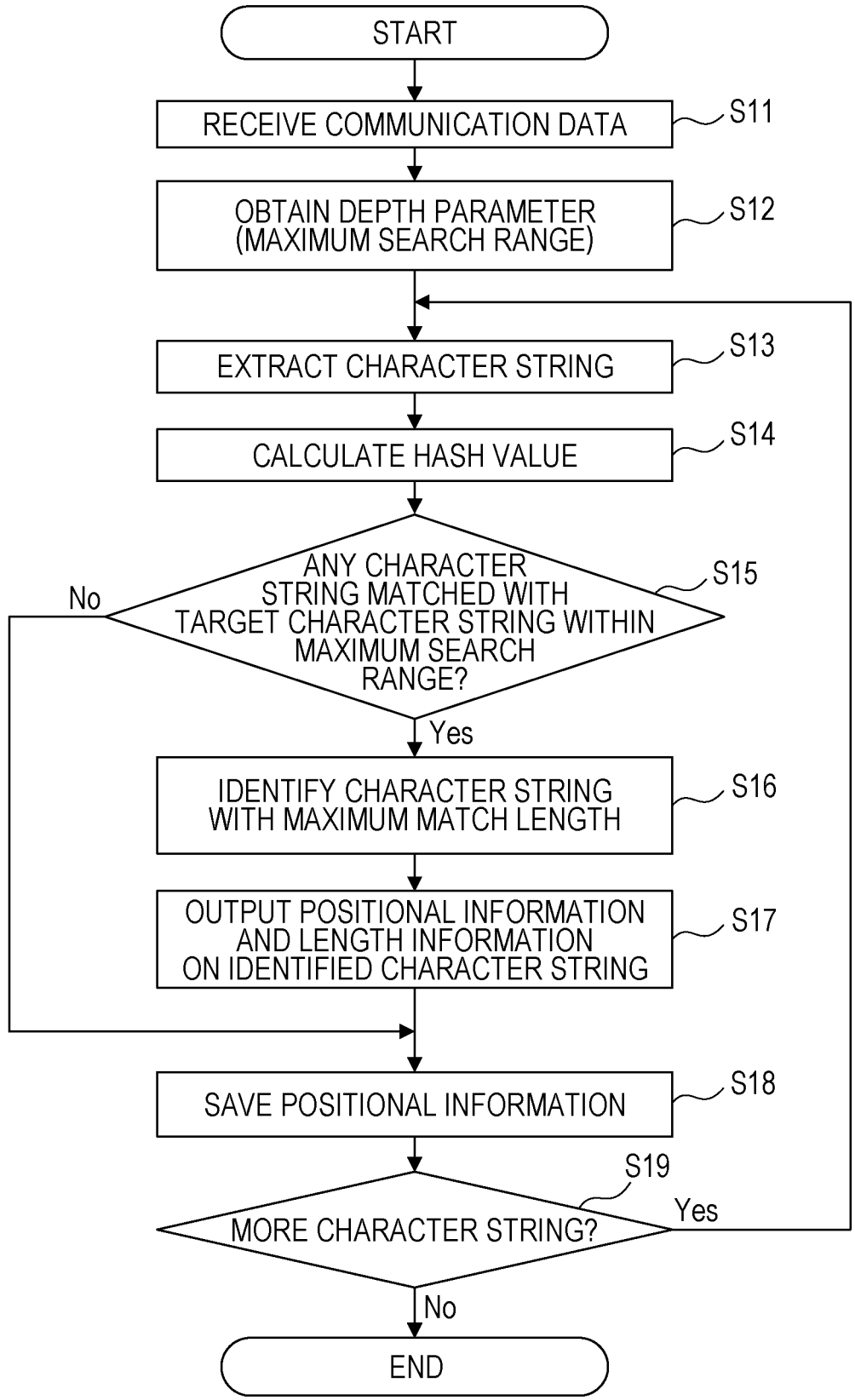
FIG. 9 is a flowchart illustrating an example of processing to be performed by a compressing unit.

FIG. 9 is a flowchart illustrating an example of processing by the compressing unit 14. In this example, the parameter determining unit 15 calculates a maximum search range max_dist as the depth parameter. The latest maximum search range max_dist is saved in a memory region which may be referred by the compressing unit 14.

In S11, the compressing unit 14 receives communication data. The communication data are text data here.

In S12, the compressing unit 14 obtains the depth parameter calculated by the parameter determining unit 15. The depth parameter is the maximum search range max_dist which has been described with reference to FIG. 3. In other words, for example, the compressing unit 14 obtains a maximum search range max_dist which is expected to minimize the estimated transfer time for the received communication data.

In S13, the compressing unit 14 extracts a character string from the received communication data. The character string to be extracted here may include one word ("VERY" in FIG. 3) or two or more words ("the Rabbit" in FIG. 3). The compressing unit 14 may extract character strings in order from the beginning of the communication data, for example. Hereinafter, a character string extracted in S13 may sometimes be called a "target character string".

In S14, the compressing unit 14 calculates a hash value of the target character string. The algorithm for calculating the hash value is not particularly limited.

In S15 and S16, the compressing unit 14 searches a character string that is matched with the target character string or a part of the target character string within the maximum search range with respect to the position of the target character string. In this case, the compressing unit 14 may use the hash value of the target character string to search a character string that is matched with the target character string or a part of the target character string. In this case, the compressing unit 14 includes a hash value table.

FIG. 10 illustrates an example of the hash value table to be referred by the compressing unit 14. The hash value table stores a character string extracted from communication data received by the WAN acceleration apparatus 10, a hash value of the extracted character string, and positional information indicating the occurrence position of the extracted character string in association with each other.

The compressing unit 14 searches for a record having a hash value matched with the hash value of the target character string through the hash value table. In this case, the search is performed within the maximum search range. Through this search, whether any character string matched with the target character string or a part of the target character string exists or not is determined.

For example, "the Rabbit" on the seventh row may be extracted as the target character string in the communication data illustrated in FIG. 3. In this case, a search for "the" results in "the" on the sixth row. A search for "the Rabbit" results in "the Rabbit" on the third row. In other words, a plurality of character strings may be found for one target character string. If a plurality of character strings is found for one target character string, the compressing unit 14 identifies a character string having a maximum matched length from the plurality of character strings. If one character string is found for one target character string, the compressing unit 14 identifies the character string as a character string having a maximum matched length.

In S17, the compressing unit 14 outputs positional information and length information on the character string identified in S15 and S16. The positional information is saved in the hash value table. The length information indicates the length of the character string identified in the S15 and S16.

The positional information and length information output in S17 are given to the data transmitting unit 18. The data transmitting unit 18 transmits the positional information and length information to the destination apparatus instead of the target character string. On the other hand, if no character string matched with the target character string or a part of the target character string exists within the maximum search range (S15: No), the compressing unit 14 outputs the target character string. In this case, the data transmitting unit 18 transmits the target character string to the destination apparatus.

In S18, the compressing unit 14 saves the positional information indicating the position on the target character string in the hash value table. In this case, the compressing unit 14 also saves the hash value of the target character string.

In S19, the compressing unit 14 determines whether any character string that has not undergone the processing in S14 to S18 exists within the communication data. If such a character string remains, the processing by the compressing unit 14 returns to S13. In other words, for example, the processing in S14 to S18 is performed on all character strings within the communication data.

The compressing unit 14, as described above, compresses communication data based on a depth parameter (or maximum search range max_dist) depending on the usable communication band width between the WAN acceleration apparatus 10 and the destination apparatus. The depth parameter is determined for a shorter (or preferably minimum) data transfer time (being a sum of the network transfer time and the compression processing time). Thus, the compressing unit 14 compresses communication data in accordance with the flowchart illustrated in FIG. 9 so that the data transfer time may be reduced.

Figure 11:
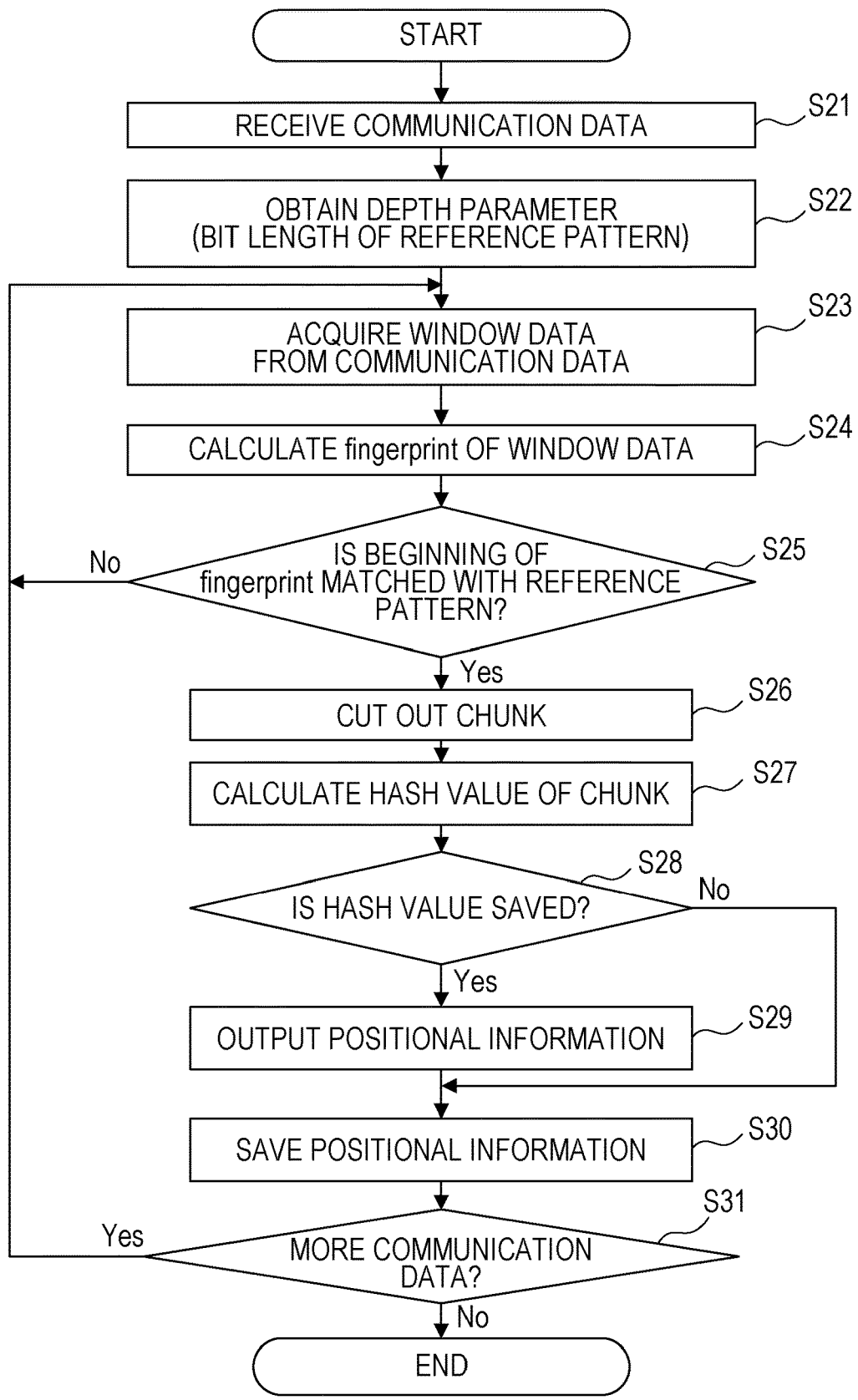
FIG. 11 is a flowchart illustrating an example of processing to be performed by an overlap removing unit.

FIG. 11 is a flowchart illustrating an example of processing to be performed by the overlap removing unit 16. In this example, the parameter determining unit 17 calculates a bit length m of the reference pattern as a depth parameter. The latest bit length m is saved in a memory region that may be referred by the overlap removing unit 16.

In S21, the overlap removing unit 16 receives communication data. The communication data are not limited to text data, but the overlap removing unit 16 may process digital data in any arbitrary format.

In S22, the overlap removing unit 16 obtains the depth parameter calculated by the parameter determining unit 17. The depth parameter is a bit length m of the reference pattern described with reference to FIG. 4 and FIG. 5. In other words, the overlap removing unit 16 obtains a bit length m which is expected to minimize the estimated transfer time for the received communication data.

In S23, the overlap removing unit 16 acquires window data from the received communication data. The window data is extracted with an extraction window having a predetermined length described with reference to FIG. 5.

In S24, the overlap removing unit 16 calculates a hash value of the window data extracted in S23. In this example, Rabin fingerprint algorithm is applied to calculate the hash value. In the flowchart illustrated in FIG. 11, a hash value calculated by Rabin fingerprint algorithm may sometimes be called a "fingerprint".

In S25, the overlap removing unit 16 compares the beginning m bits of the hash value generated in S24 and the reference pattern. "m" is designated based on the depth parameter acquired in S22. In other words, for example, the bit length of the reference pattern is equal to "m".

If the beginning m bits of the hash value are not matched with the reference pattern, the processing by the overlap removing unit 16 returns to S23. In this case, the overlap removing unit 16 acquires the next window data by shifting the extraction window by one byte. Therefore, the processing in S23 to S25 is repeatedly performed until window data is detected corresponding to a hash value having the beginning m bits matched with the reference pattern.

If the beginning m bits of the hash value are matched with the reference pattern, the overlap removing unit 16 cuts out a chunk from the communication data in S26. Hereinafter, the chunk newly generated in S26 may also be called a "target chunk". The average size of chunks cut out from communication data depends on the bit length m of the reference pattern.

In S27, the overlap removing unit 16 calculates a hash value of the target chunk. The hash value may be calculated by SHA1, for example, without limiting thereto. In S28, the overlap removing unit 16 determines whether the hash value calculated in S27 is saved in the hash value table or not.

Figures 12, 13:
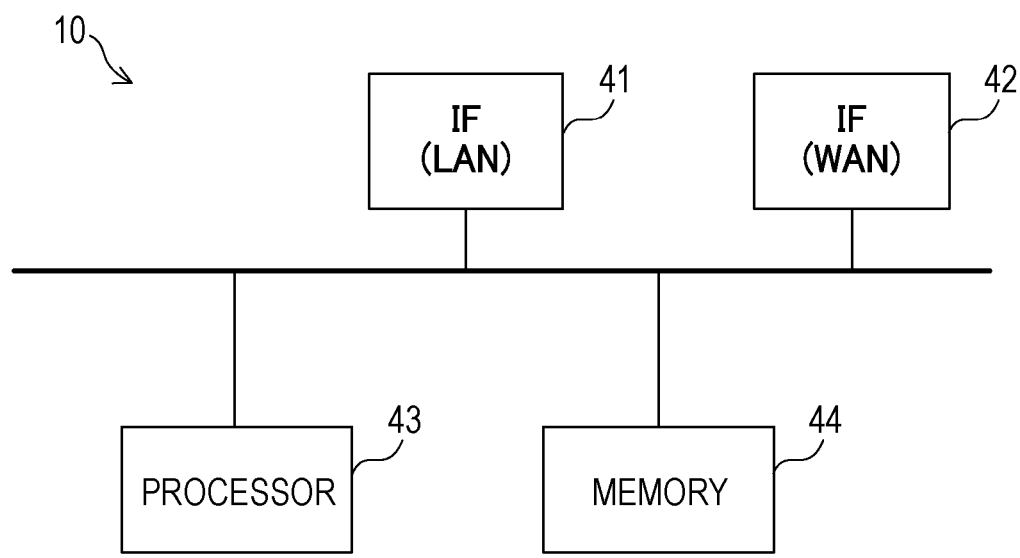
FIG. 12 is a diagram illustrating an example of a hash value table to be referred by the overlap removing unit.
FIG. 13 illustrates an example of a hardware configuration of a WAN acceleration apparatus.

FIG. 12 illustrates an example of the hash value table that is referred by the overlap removing unit 16. The hash value table stores hash values and occurrence positional information indicating the position of each of the chunks in association with each other.

The overlap removing unit 16 searches for a record having a hash value matched with the hash value of the target chunk in the hash value table. Through this search, whether any chunk identical to the target chunk has been transmitted to the destination apparatus in the past or not is determined.

If a record having a hash value matched with the hash value of the target chunk is found, the overlap removing unit 16 in S29 outputs positional information saved in the record. The positional information indicates the position of the chunk including data identical to those of the target chunk and transmitted to the destination apparatus in the past.

The positional information output in S29 is given to the data transmitting unit 18. The data transmitting unit 18 then transmits positional information to the destination apparatus instead of the target chunk. The positional information corresponds to ID data or an index in the example illustrated in FIG. 4. On the other hand, if no record having a hash value matched with the hash value of the target chunk is found (S28: No), the overlap removing unit 16 outputs the target chunk. In this case, the data transmitting unit 18 transmits the target chunk to the destination apparatus.

In S30, the overlap removing unit 16 saves the positional information indicating the position of the target chunk in the hash value table. Here, the positional information is saved in association with the hash value of the target chunk.

In S31, the overlap removing unit 16 determines whether any data remain which do not undergo the processing in S24 to S30 or not is determined. If any such data remain, the processing by the overlap removing unit 16 returns to S23. In other words, the processing in S24 to S30 is performed on the entire communication data.

The overlap removing unit 16, as described above, may compress communication data based on the depth parameter (i.e. the bit length m of the reference pattern) depending on the usable communication band width between the WAN acceleration apparatus 10 and the destination apparatus. The depth parameter is determined for a shorter (or preferably minimum) data transfer time (or a sum of the network transfer time and the compression processing time). Thus, the overlap removing unit 16 compresses communication data in accordance with the flowchart illustrated in FIG. 11 so that the data transfer time may be reduced.

FIG. 13 illustrates an example of a hardware configuration of the WAN acceleration apparatus 10. The WAN acceleration apparatus 10 includes interfaces 41 and 42, a processor 43, and a memory 44. However, the WAN acceleration apparatus 10 may include other circuits than those illustrated in FIG. 13.

The interface 41 terminates a signal received over the LAN 2 and outputs a signal to the LAN 2. Functions of the TCP receiving unit 11 illustrated in FIG. 2 are implemented by the interface 41. The interface 42 terminates a signal received over the WAN 4 and outputs a signal to the WAN 4. The functions of the data transmitting unit 18 illustrated in FIG. 2 are implemented by the interface 42.

The processor 43 executes a communication control program stored in the memory 44 to provide functions of the measuring unit 12 and reducing unit 13 illustrated in FIG. 2. In other words, the processor 43 executes the communication control program to implement the processing in the flowcharts illustrated in FIG. 9 and FIG. 11. The communication control program may be stored in the WAN acceleration apparatus 10 by using a detachable memory, not illustrated. Alternatively, the WAN acceleration apparatus 10 may obtain the communication control program from a program server, not illustrated. The processor 43 may execute other programs.

The memory 44 stores the communication control program describing procedures in the flowcharts illustrated in FIG. 9 and FIG. 11. The memory 44 may also be used as a buffer region configured to temporarily store reception data. The memory 44 may further store the hash value tables illustrated in FIG. 10 and FIG. 12.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A communication apparatus comprising:
a memory; and
a processor coupled to the memory and the processor configured to:
receive communication data;
measure a usable communication band width for communication with a destination apparatus;
determine a parameter relating to a reduction ratio for a data amount of the communication data, based on the measured communication band width;
reduce the data amount of the communication data, based on the determined parameter; and
transmit the communication data of the reduced data amount to the destination apparatus, wherein
the parameter is determined such that a sum of a processing time for processing for reducing the data amount of the communication data and a network transfer time for transmitting the communication data of the reduced data amount to the destination apparatus may be minimized.

2. The communication apparatus according to claim 1, wherein the communication data are text data, and
wherein to reduce the data amount includes:
extract a target character string from the text data;
search a character string matched with the target character string or a part of the target character string, within a maximum search range with respect to the target character string; and
in a case where a character string matched with the target character string or a part of the target character string is found,
reduce the data amount of the communication data by replacing the target character string by alternative data having a data amount lower than the data amount of the target character string, and
determine the maximum search range as the parameter, based on the measured communication band.

3. The communication apparatus according to claim 1, wherein to reduce the data amount includes:
divide the communication data into a plurality of data blocks;
calculate a hash value of each of the plurality of data blocks; and
in a case where the hash value of a first data block of the plurality of data blocks and the hash value of a second data block of the plurality of data blocks are matched,
replace the second data block by alternative data having a data amount lower than the data amount of the second data block to reduce the data amount of the communication data, and
determine a value for designating an average size of the plurality of data blocks as the parameter, based on the measured communication band width.

4. A communication control method comprising:
receiving communication data;
measuring a usable communication band width for communication with a destination apparatus;
determining a parameter relating to a reduction ratio for a data amount of the communication data, based on the measured communication band width;
reducing the data amount of the communication data, based on the determined parameter; and
transmitting the communication data of the reduced data amount to the destination apparatus, by a processor, wherein
the parameter is determined such that a sum of a processing time for processing for reducing the data amount of the communication data and a network transfer time for transmitting the communication data of the reduced data amount to the destination apparatus may be minimized.

5. A non-transitory computer-readable recording medium storing a program that causes a computer to execute a procedure, the procedure comprising:
receiving communication data;
measuring a usable communication band width for communication with a destination apparatus;
determining a parameter relating to a reduction ratio for a data amount of the communication data, based on the measured communication band width;
reducing the data amount of the communication data, based on the determined parameter; and
transmitting the communication data of the reduced data amount to the destination apparatus, wherein
the parameter is determined such that a sum of a processing time for processing for reducing the data amount of the communication data and a network transfer time for transmitting the communication data of the reduced data amount to the destination apparatus may be minimized.

* * * * *